US 7,071,763 B2

(12) United States Patent
Blyth

(10) Patent No.: US 7,071,763 B2
(45) Date of Patent: Jul. 4, 2006

(54) TRANSISTOR CIRCUITS FOR SWITCHING HIGH VOLTAGES AND CURRENTS WITHOUT CAUSING SNAPBACK OR BREAKDOWN

(75) Inventor: Trevor Blyth, Sandy, UT (US)

(73) Assignee: Emosyn America, Inc., Sunnyvale, CA (US)

( * ) Notice: Subject to any disclaimer, the term of this patent is extended or adjusted under 35 U.S.C. 154(b) by 0 days.

(21) Appl. No.: 10/378,413

(22) Filed: Mar. 3, 2003

(65) Prior Publication Data

US 2004/0125524 A1     Jul. 1, 2004

Related U.S. Application Data

(60) Provisional application No. 60/436,702, filed on Dec. 27, 2002.

(51) Int. Cl.
  H03K 17/687    (2006.01)
  H03K 17/08     (2006.01)

(52) U.S. Cl. .................. 327/436; 327/328; 327/404

(58) Field of Classification Search ............ 327/328, 327/404, 427, 434, 436, 541, 543, 581; 365/189.09
  See application file for complete search history.

(56) References Cited

U.S. PATENT DOCUMENTS

| 4,317,055 A | * | 2/1982 | Yoshida et al. ............. 327/541 |
| 4,692,643 A | * | 9/1987 | Tokunaga et al. ........... 327/436 |
| 5,530,394 A | * | 6/1996 | Blossfeld et al. ........... 327/530 |
| 5,748,531 A | * | 5/1998 | Choi ..................... 365/185.18 |
| 5,963,061 A | * | 10/1999 | Briner .......................... 327/55 |

* cited by examiner

Primary Examiner—Timothy P. Callahan
Assistant Examiner—Terry L. Englund
(74) Attorney, Agent, or Firm—Ryan, Mason & Lewis, LLP

(57) ABSTRACT

A switching circuit is disclosed for switching high voltages and high currents, if necessary, without causing snapback or breakdown. The disclosed high voltage, high current switching circuit comprises a first set of series-connected transistors that includes a plurality of transistors to switch a high voltage without inducing snapback or breakdown; and a second set of series-connected transistors that includes one or more transistors to switch a high current. The first and second sets of series-connected transistors are connected in parallel. The gates of the second set of series-connected transistors are enabled to cause conduction through the second set of series-connected transistors. In addition, a voltage detector is connected to an output of the first and second sets of series-connected transistors. The output of the voltage detector is coupled to the enabling means.

25 Claims, 6 Drawing Sheets

300

500

600

TRANSISTOR CIRCUITS FOR SWITCHING HIGH VOLTAGES AND CURRENTS WITHOUT CAUSING SNAPBACK OR BREAKDOWN

CROSS REFERENCE TO RELATED APPLICATIONS

This application claims the benefit of U.S. Provisional Application No. 60/436,702, filed Dec. 27, 2002.

FIELD OF THE INVENTION

The present invention relates to a method and apparatus for protecting transistor circuits that are exposed to high voltages, and, more particularly, to a method and apparatus for preventing snapback or a breakdown condition in transistor circuits that switch high voltages and high current, if necessary.

BACKGROUND OF THE INVENTION

Many semiconductor circuits require the switching of high voltages. For example, floating gate non-volatile memory devices require voltages to erase and program the memory device that are significantly higher than the voltages needed for other device functions, such as reading data from the memory or communicating with other semiconductor circuits. Thus, semiconductor circuits often employ a voltage conversion circuit to provide the high voltage levels required by the non-volatile memory and other associated devices. The use of such high voltages, however, leads to the possibility of snapback or breakdown, both of which are extremely undesirable.

Snapback occurs in some metal oxide semiconductor (MOS) transistors if a large voltage difference exists between drain and source (Vds) and the gate voltage (Vgs) is sufficient to cause a drain current (Ids) to flow that is above a certain threshold. High acceleration fields close to the drain region create electron-hole pairs and, in the case of n-channel transistors, holes flowing into the substrate can cause an increase in voltage near the source region. If the voltage increase is sufficient to forward bias the source junction, then additional carriers are injected into the substrate and the npn transistor formed by the source and drain junctions becomes highly conductive. The npn transistor current creates additional electron-hole pairs and, if the current gain of the bipolar structure is greater than one, the cycle is regenerative and snapback is said to occur. Once snapback occurs, the gate voltage ceases to control current flow and circuit functionality can be lost or the device can be destroyed.

Different transistor fabrication processes have different limits for the conditions that initiate snapback. In one exemplary transistor technology, the Vds and Ids limits that initiate snapback are 5V (Vds_sb) and 10 nA/$\mu$m (Ids_sb), respectively. Thus, to avoid snapback, the voltage between drain and source should be less than Vds_sb. Alternatively, if a high Vds cannot be avoided and Vds is greater than Vds_sb, then snapback can be avoided by limiting the drain/source current to a value less than Ids_sb. In this case, the source region does not become sufficiently forward biased to inject current into the substrate. However, imposing a limit of only 10 nA/$\mu$m is too restrictive for most practical circuits. Either the current would need to be very small and performance would be compromised, or the transistor width would need to be overly large, resulting in an increase in die size.

Furthermore, during the production testing of non-volatile memories it is a common requirement to switch a relatively high current that is sourced from a high voltage supply. While currents from the high voltage source may be low during normal operation, the currents can be much higher during certain test modes during production testing when many cells are written simultaneously. For instance, for the exemplary transistor technology, the load presented by the memory cell is mainly capacitive during an erase operation and requires only a few microamps from the high voltage supply during a program operation. In normal modes, only a few bits or a small number of bytes are being written at any one time and an internal charge pump is able to provide the high voltages and currents. During test modes, however, in order to reduce the time required to test the memory, a large number of cells (on the order of thousands) are written simultaneously and the current demand is increased by a factor approximately equal to the increase in the number of cells being written. The current required from the high voltage supply may now be beyond the capability of the on-chip charge pump and an external supply needs to be connected to either assist or replace the charge pump.

In addition to the exemplary transistor technology, circuits using other transistor technologies or circuits without an on-chip charge pump may also make use of a switched external high voltage supply. Even in memories that do not use a direct current to program cells, it may be desirable to connect a low impedance high voltage source to allow charge up of the large capacitances associated with "mass mode" tests in a short time period. Other memory types may require high currents to write data in a normal mode. Thus, it is a common practice to connect an external high voltage supply to a connection terminal (pad) of the semiconductor circuit, such supply being used to erase or program the non-volatile memory (or both).

The external high voltage supply available on low-cost production testers is often limited to a simple direct current (DC) supply. In contrast, the internal supply that is required to write to the memory is more complex and must be switched, alternately high and low, often with ramp rates and timing relationships that are controlled by a combination of tester and internal control signals.

Thus, a need exists for on-chip circuits that are capable of switching and controlling high voltages, sometimes with high current, without inducing snapback. A further need exists for a method and apparatus for switching high voltages and high currents, if necessary, without inducing snapback or breakdown. Another need exists for a method and apparatus for switching high voltages and high currents, if necessary, for example, during accelerated testing of non-volatile memory semiconductor circuits.

SUMMARY OF THE INVENTION

Generally, a switching circuit is disclosed for switching high voltages and high currents, if necessary, without causing snapback or breakdown. The disclosed high voltage, high current switching circuit comprises a first set of series-connected transistors that includes a plurality of transistors to switch a high voltage without inducing snapback or breakdown; and a second set of series-connected transistors that includes one or more transistors to switch a high current. The first and second sets of series-connected transistors are connected in parallel. The gates of the second set of series-connected transistors are enabled to cause conduction through the second set of series-connected transistors. In addition, a voltage detector is connected to an output of the first and second sets of series-connected transistors. The output of the voltage detector is coupled to the enabling means.

The first set of series-connected transistors can be comprised of n-channel transistors and the second set of series-connected transistors can be comprised of p-channel transistors. A charge pump can be connected to an output of the first and second set of series-connected transistors. An external high voltage source may drive an input of the first and second set of series-connected transistors. The gates of the transistors in the first set of series-connected transistors can be biased to increasing voltages such that a voltage difference across the first set of series-connected transistors is shared (e.g., approximately equally) across each of the transistors comprising the first set of series-connected transistors. A ramp limit may optionally limit a ramp rate of an output of the high voltage switch.

If a high voltage is needed, without the high current, the switching circuit in accordance with the present invention comprises a plurality of series-connected transistors, each having a gate biased to an increasing voltage such that a voltage difference across the plurality of series-connected transistors is shared across each of the transistors comprising the plurality of series-connected transistors; and a switching transistor connected in series with any one of said plurality of series-connected transistors wherein a high voltage can be switched without snapback or breakdown.

A more complete understanding of the present invention, as well as further features and advantages of the present invention, will be obtained by reference to the following detailed description and drawings.

DETAILED DESCRIPTION OF PREFERRED EMBODIMENTS

The present invention provides on-chip circuits that are capable of switching and controlling high voltages, sometimes with high current, without inducing snapback or breakdown. It has been observed that more recent MOS transistor fabrication processes are more susceptible to snapback. Thus, many prior art circuits cannot perform the desired function, or must be used with additional restrictions imposed.

Snapback in Conventional Circuits

Figure 1:
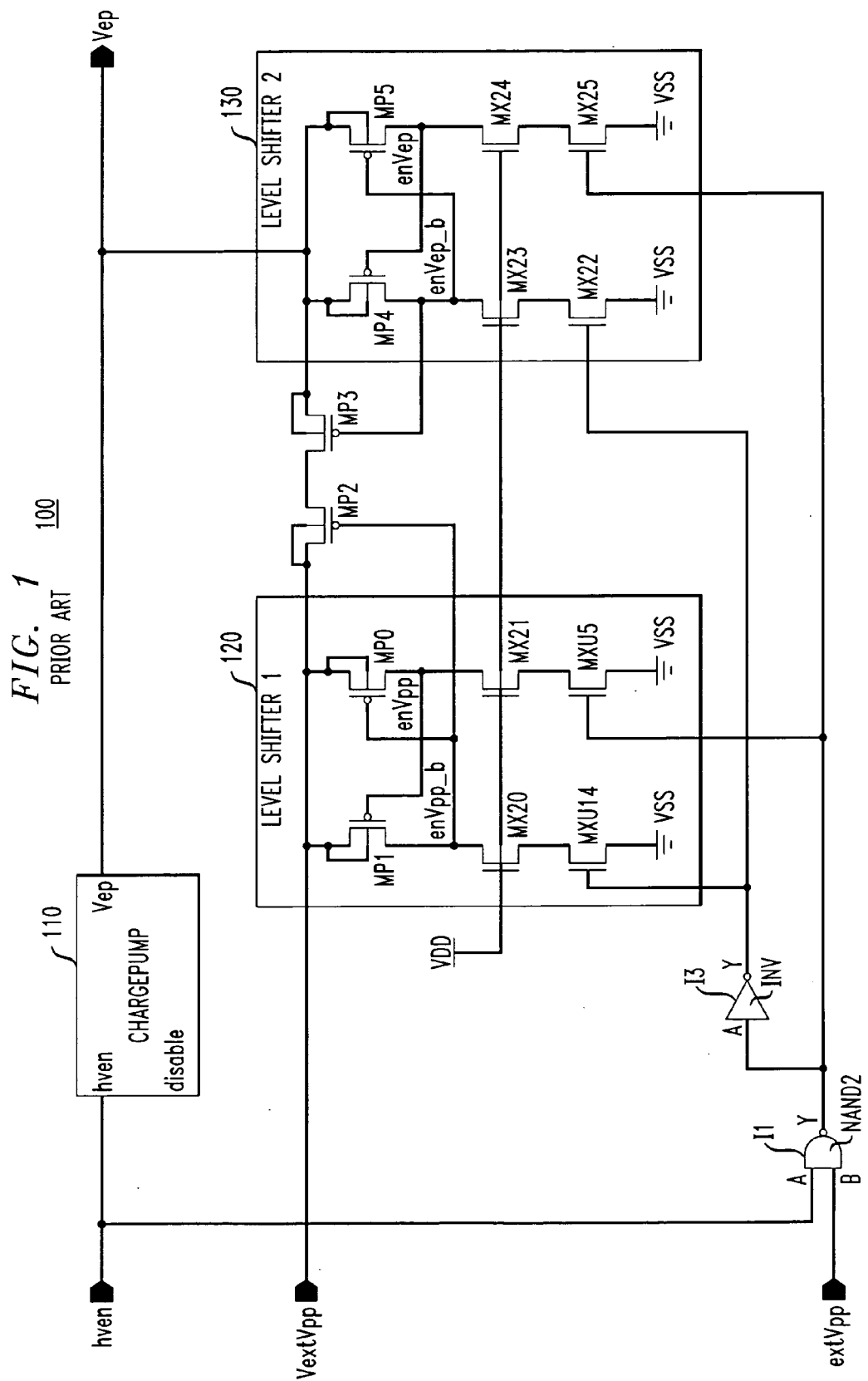
FIG. 1 is a schematic diagram of a conventional circuit for switching voltages and current.

FIG. 1 is an exemplary prior art circuit 1.00 for switching voltages and current. The output signal Vep is supplied from either a charge pump 110 or through transistors MP2 and MP3 from an external supply connected to the input pin VextVpp. The charge pump 110 is enabled when the control signals hven equals 1 and extVpp equals 0; transistors MP2 and MP3 turn on when hven equals 1 and extVpp equals 1.

Level shifter 1 (120) and level shifter 2 (130) provide the gate voltages for transistors MP2 and MP3, respectively. Level shifter 1 (120) is composed of transistors MP0, MP1, MX20, MX21, MXU14 and MXU5; level shifter 2 (130) is composed of transistors MP4, MP5, MX22, MX23, MX24 and MX 25, as is well known in the art.

As shown in FIG. 1, the n-wells of transistors MP2 and MP3 are connected separately to VextVpp and Vep, respectively, to allow a high voltage to exist on either VextVpp or Vep without forward biasing the low voltage well. The VextVpp/Vep path is turned on by application of a logic "1" (high) to input pins hven and extVpp. A logic "0" is output from nand gate I1 and a logic "1" is output from inverter I3. It follows then, that level shifter nodes enVpp_b and enVep_b equal 0V. Furthermore, enVpp equals VextVpp and enVep equals Vep. The low voltage on the gates of p-channel transistors MP2 and MP3 turns on both transistors and VextVpp is connected to Vep. The dimensions of MP2 and MP3 can be selected to allow high currents to flow from VextVpp to Vep with only a small voltage drop between VextVpp and Vep. The path between VextVpp and Vep is turned off by application of a logic "0" on either hven or extVpp. Both level shifters 120, 130 change state and a voltage equal to VextVpp is applied to the gate of MP2 and a voltage equal to Vep is applied to the gate of MP3.

In the conventional circuit 100 of FIG. 1, the p-channel transistors must be capable of supporting the maximum voltages that can exist on either VextVpp or Vep without breakdown. In other words, BVDSS of the p-channel transistors is greater than the maximum voltage that can appear on their drain/source voltage nodes. In contrast, the n-channel BVDSS may be lower than VextVpp or Vep by as much as a voltage approximately equal to the power supply voltage Vdd. The improved tolerance to breakdown is due to the presence of transistors MX20, MX21, MX23 and MX24 which have their gates connected to Vdd, as is well known in the art. A similar circuit topology may be employed on the p-channel side if improved tolerance to p-channel BVDSS breakdown is also required.

The problems encountered with the circuit 100 of FIG. 1 become more severe with recent semiconductor manufacturing processes, which are more susceptible to snapback. If, in response to control signals hven and extVpp, the VextVpp path is changed from a non-selected state to a selected state while a high voltage is applied to VextVpp, there is a possibility of snapback from several sources. Switching the state of a level shifter 120, 130 requires that current flows through n-channel transistors on one side of the latch and through p-channel transistors on the other side. Typical values of VextVpp and Vep are about 12 to 14 Volts and instantaneous currents are several tens or hundreds of microamps.

The only ways to avoid snapback with such a circuit topology for the level shifter 120, 130 would be to either limit the current by transistor sizing or to ensure that both VextVpp and Vep supplies are at a low voltage while switching occurs and then raise the supplies to a high voltage after the level shifters settle. Transistor sizing would lead to overly large device sizes and imposing restrictions on VextVpp would eliminate the use of simple external DC high voltage supplies that are available on low-cost integrate circuit testers. A more difficult problem occurs with the high current switches MP2 and MP3. The current requirement can be as high as several tens of milliamperes, so short channels are necessary and keeping current densities below Ids_sb would make extremely large device widths impractical.

High Voltage/High Current Switch Circuits without Snapback

Figure 2:
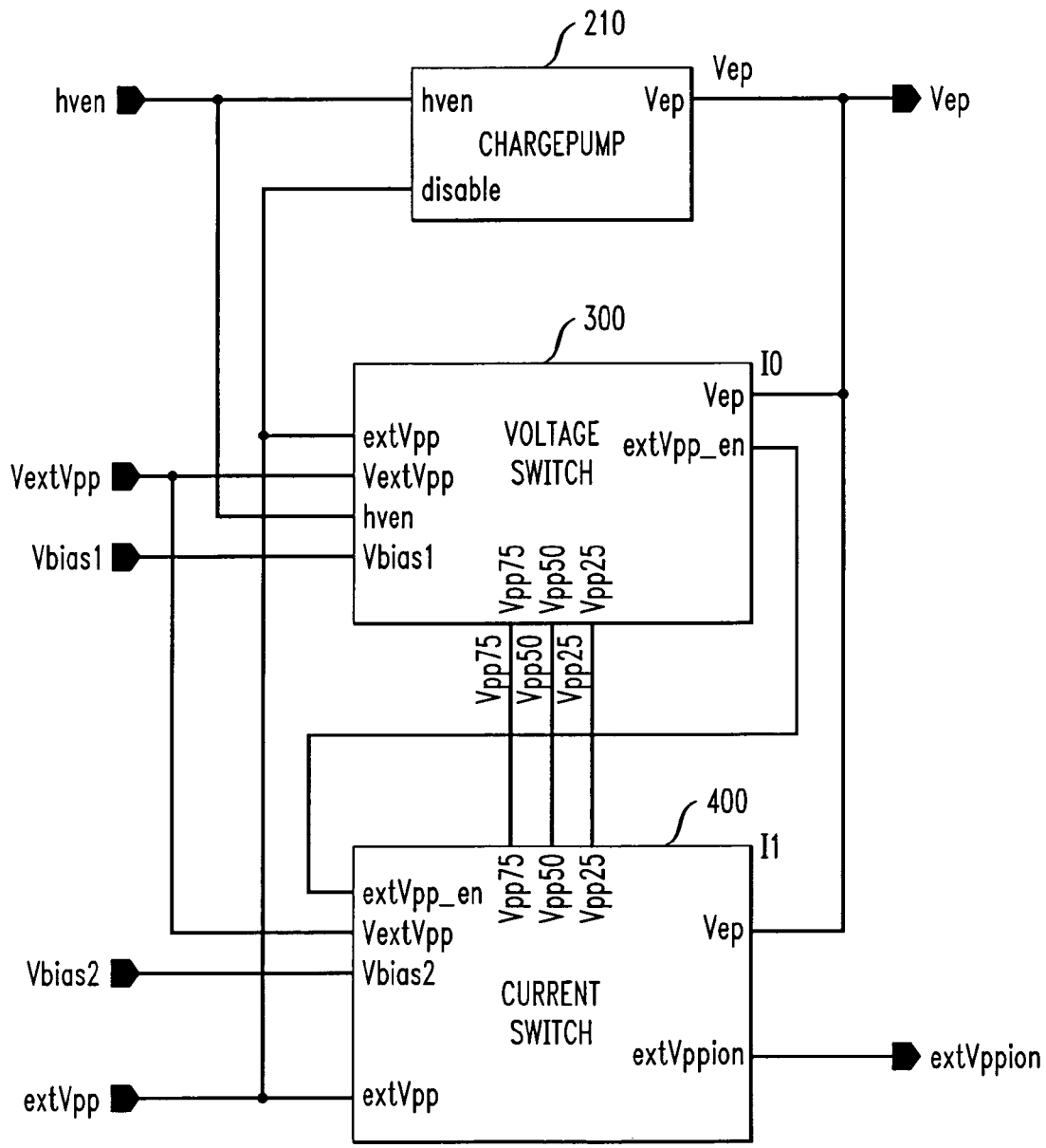
FIG. 2 is a block diagram of one embodiment of a circuit for switching voltages and current in accordance with the present invention.

FIG. 2 shows a block diagram of a circuit 200 that provides for high voltage, high current switching without inducing snapback in accordance with the present invention. The output Vep is a high voltage supply that is typically used to supply erase and program circuitry in a non-volatile memory or to supply other high voltage circuits. Vep is supplied by either a charge pump 210 and/or by a combination of a voltage switch 300, discussed further below in conjunction with FIG. 3, and a current switch 400, discussed further below in conjunction with FIG. 4, operating in conjunction with each other. The function of the voltage switch 300 and current switch 400 is to provide a low impedance path to an external DC voltage source, which can be connected to the input pin VextVpp. The signals "hven" and "extVpp" are external control signals that enable the charge pump 210 and/or turn on the conduction paths within the voltage switch 300 and the current switch 400. Input signals Vbias1 and Vbias2 are voltages to create pre-assigned current bias levels. In response to control signals hven and extVpp equal to 1, the voltage switch 300 turns on and the voltage on Vep begins to rise.

As discussed further below in conjunction with FIG. 3, one or more ramp control circuits may optionally be incorporated into the voltage switch 300 to control the ramp rate at which Vep rises. During the ramp-up period, there is a relatively small current load on Vep (but still large enough to cause snapback in the circuit 100 depicted in FIG. 1). When Vep has risen to a voltage within 1 or 2 volts of VextVpp, a voltage detector within the current switch 400 (comprised of transistors MP0–1, MP4–9, MXU5, MXU6, MXU0, MX20–22 and MX 30), enables the current switch 400 and a low impedance path is now engaged between VextVpp and Vep. A logic output from the voltage detector may also serve as an indication to external circuits that a high current can now be supplied from Vep, such as for mass programming in test mode. FIG. 2 indicates that the extVpp signal is connected to a disable input on the charge pump 210. Such an arrangement would cause either the charge pump 210 or the external voltage source (not shown) to be connected to Vep but not both together. Alternatively, the disable input could be eliminated such that both voltage sources can be enabled simultaneously, in which case the external voltage source connected to VextVpp supplements the current from the charge pump.

Figure 3:
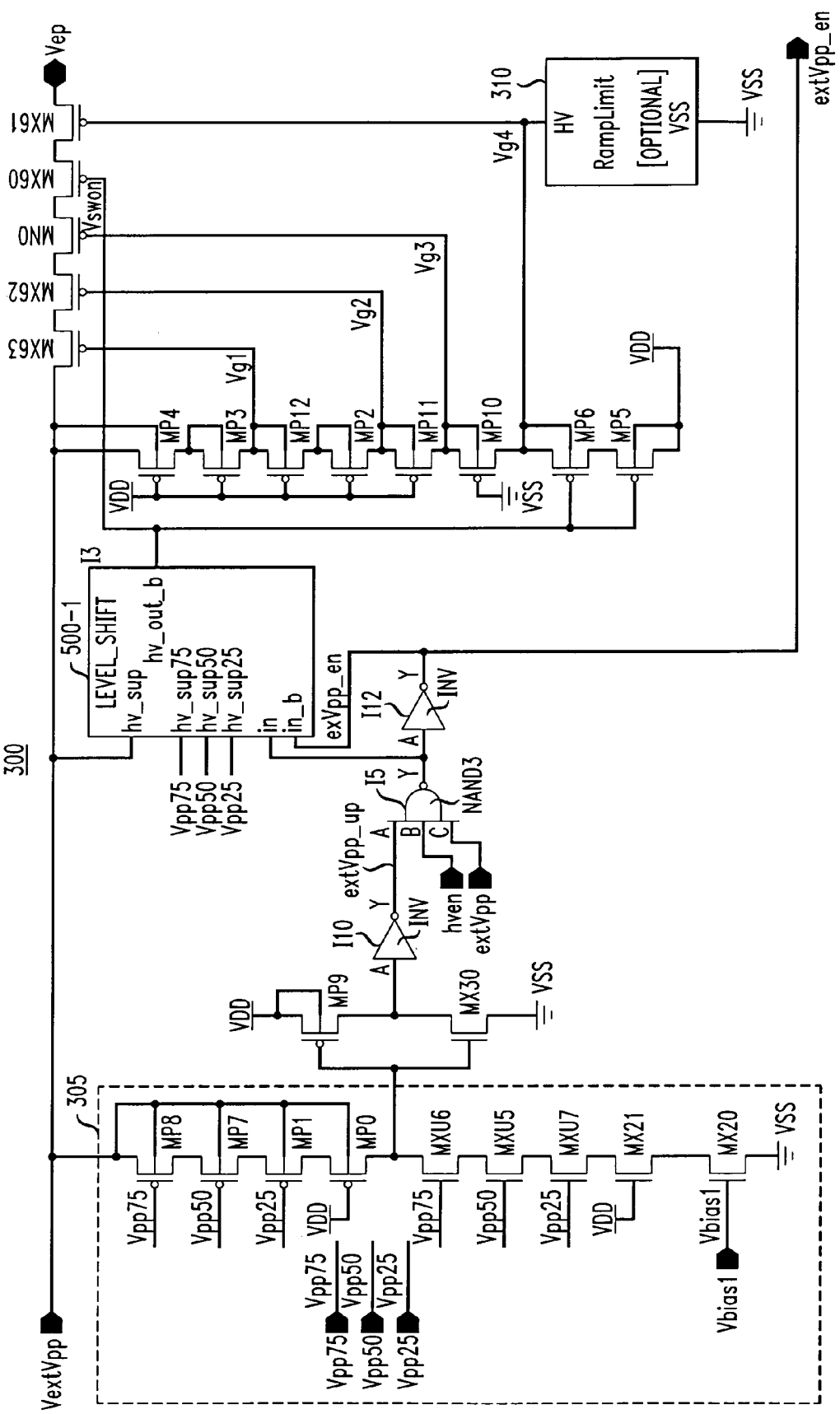
FIG. 3 is a schematic diagram of an exemplary voltage switch of FIG. 2.
Figure 6:
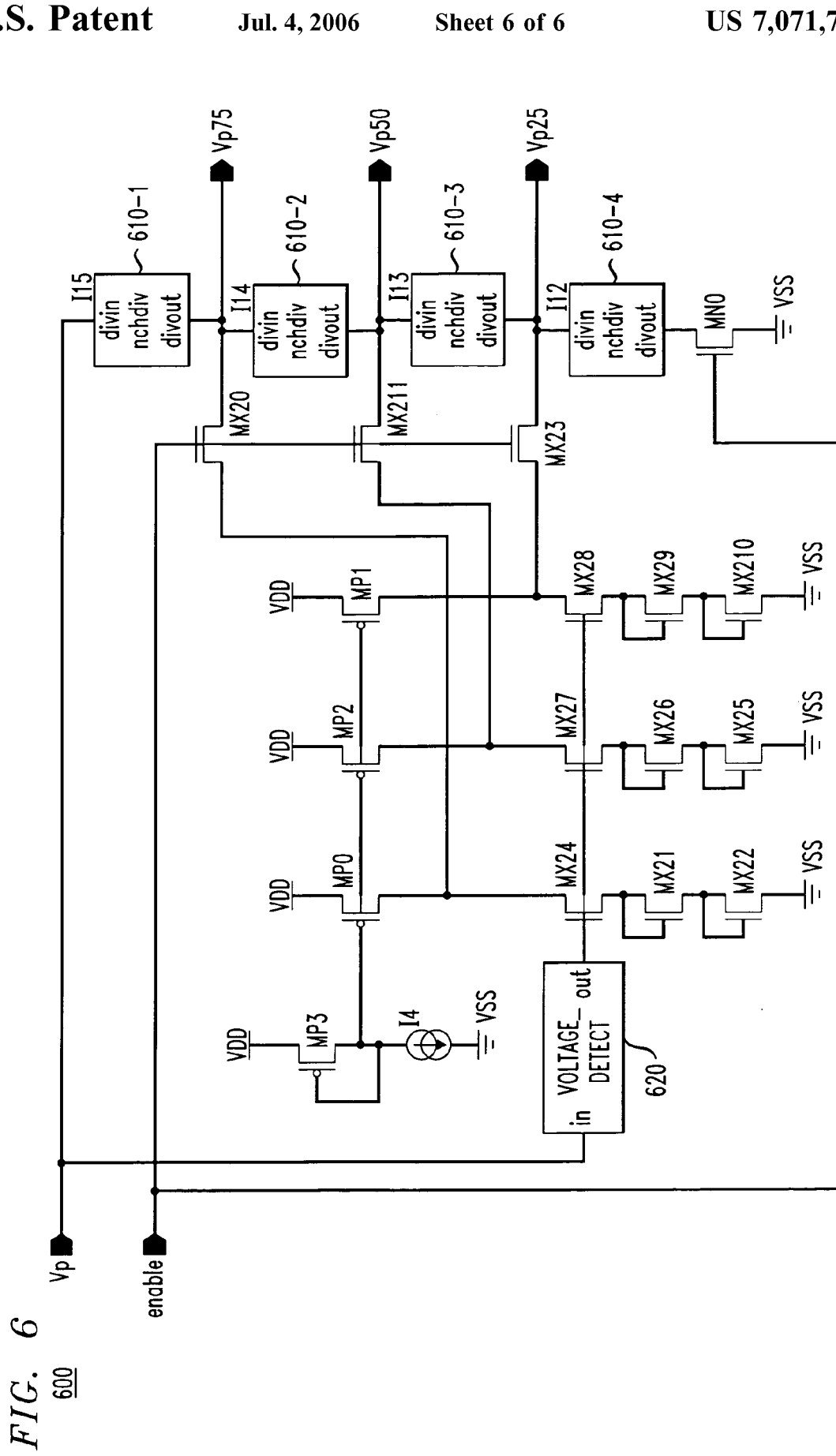
FIG. 6 is a schematic diagram of an exemplary voltage divider in accordance with the present invention.

FIG. 3 shows the details of the voltage switch 300 of FIG. 2 in further detail. The stack of series transistors placed between VextVpp and Vss and consisting of transistors MP8, MP7, MP1, MP0, MXU6, MXU5, MXU7, MX21 and MX20 comprise a voltage detector 305 that detects the presence of a high voltage on the VextVpp pin. The purpose of the voltage detector 305 is to allow the voltage switch 300 to be enabled only when a high voltage exists on VextVpp (extVpp_up equals "1") and hven and extVpp are equal to "1". While the voltage detector 305 is not necessary to realize one of the other aspects of this invention, namely, the control of high currents from a high voltage source, it illustrates the concept of voltage division to reduce the Vds across a transistor. By reducing Vds to a voltage below Vds_sb it is possible to switch high voltages without entering a snapback condition. The gates of some of the series transistors in the voltage detector 305 are connected to signals Vpp25, Vpp50 and Vpp75 (voltages equal to approximately 25%, 50% and 75% of Vpp, respectively). Vpp25, Vpp50 and Vpp75 are generated by a voltage divider supplied by Vpp, an example of which is shown in FIG. 6.

As shown in FIG. 3, the signals Vpp25, Vpp50 and Vpp75 are connected to the gates of the transistors in the voltage detector 305. When VextVpp is equal to Vdd and Vpp25, Vpp50 and Vpp75 are all at voltages approximately equal to 1.2V, all transistors MP8, MP7, MP1, MXU6, MXU5 and MXU7 are in a conductive state. When VextVpp is increased to higher voltages, the voltage divider causes Vpp25, Vpp50 and Vpp75 to increase also. As previously stated, Vpp25, Vpp50 and Vpp75 are at voltages approximately equal to 25%, 50% and 75% of VextVpp, but never less than 1.2V. Thus, transistors MP8, MP7, MP1, MXU6, MXU5 and MXU7 are always in a conductive state, irrespective of the voltage on VextVpp.

The voltage input Vbias1 biases MX20 as a current sink device. Transistor MP0 controls the conduction of the current path to VextVpp so that a path exists only when VextVpp is greater than Vdd+Vtp. In such conditions, the high level on the gates of MP9 and MX30 creates a low voltage on their drains and extVpp_up equals "1". When VextVpp is less than (Vdd+Vtp), transistor MP0 turns off, the n-channel path discharges the gates of MP9/MX30 and extVpp_up equals "0". Snapback is a concern when VextVpp is high. However, the successively increasing voltages on the gates of the series-connected transistors ensure that all transistors are not subjected to conditions that would cause snapback. Take the example of VextVpp equal to 14V, Vpp75 equal to 10.5V, Vpp50 equal to 7V, Vpp25 equal to 3.5V and Vdd equal to 2.5V. Assuming Vtn equals 1V (and, for the sake of simplicity, neglecting the variation in Vt due to body effect), the voltage on the source of MXU6 equals 9.5V, on the source of MXU5 equals 6V and on the source of MXU7 equals 2.5V. Thus, even though the current flow may be greater than Ids_sb, the Vds across each of the transistors in the series stack is less than Vds_sb and snapback is avoided. Moreover, the intermediate voltage levels on the gates of the series transistors increases the breakdown voltage of the drain/source regions to a value greater than BVDSS.

It is important to note that the circuit details and the voltages specified are intended to be illustrative and should not be restrictive. Variations are possible to allow for different process parameters and/or voltage ranges. For example, higher voltage levels on VextVpp or lower values of Vds_sb can be accommodated by increasing the number of series transistors in the current path and by making a corresponding increase in the number of voltage taps in the voltage divider.

Figure 5:
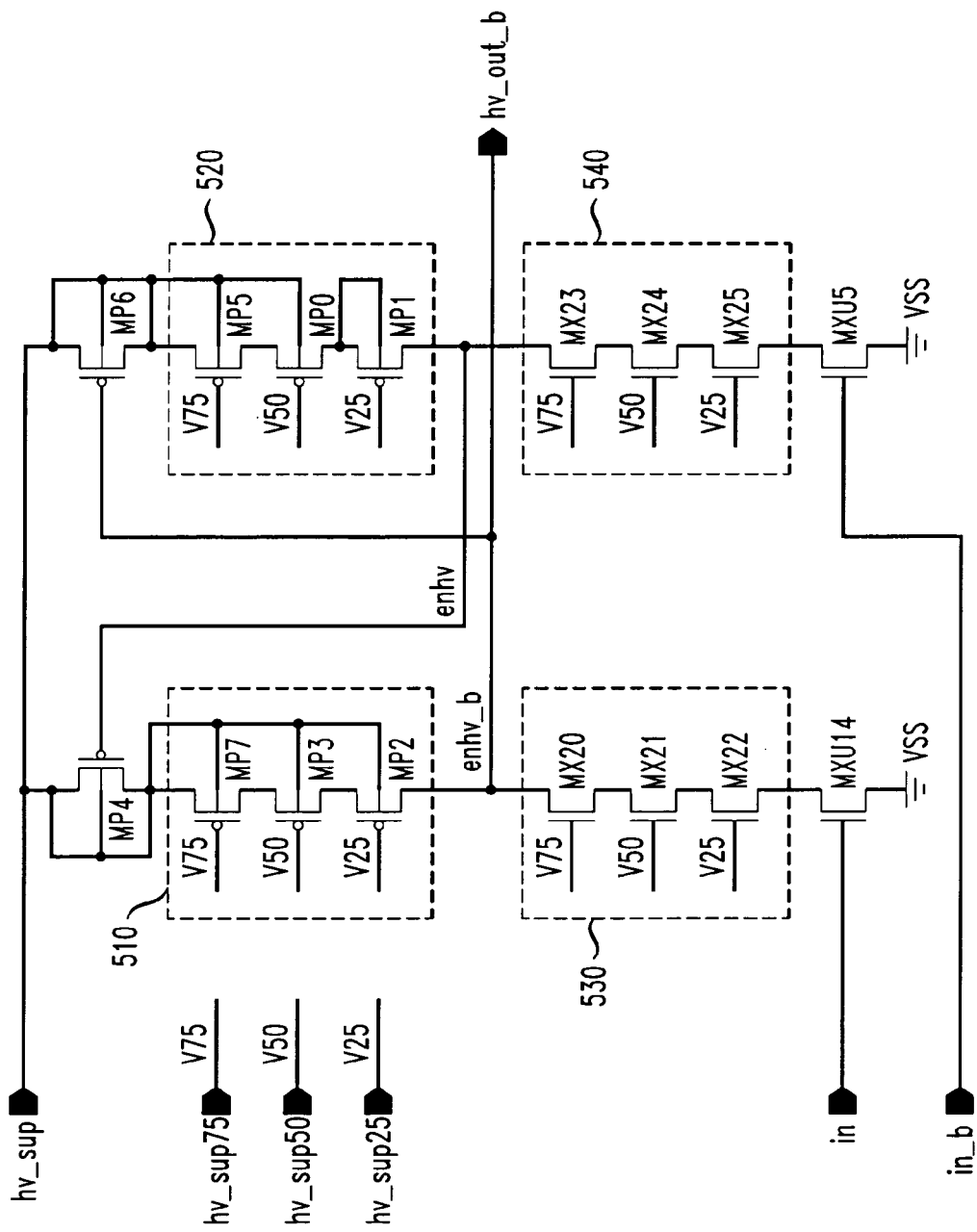
FIG. 5 is a schematic diagram of an exemplary level shifter in accordance with the present invention.

The path between the input pin VextVpp and the output pin Vep is through series high voltage n-channel transistors MX63, MX62, MN0, MX60 and MX61. As shown in FIG. 3, the gates of these transistors are connected to nodes Vg1, Vg2, Vg3, Vswon and Vg4, respectively. Initially, Vep is at a low voltage (for example, Vdd) and the Vswon output of a level shifter 500-1, discussed below in conjunction with FIG. 5, is at Vss. Even though VextVpp may be at high voltage (for example, 14V), there is no conduction path to Vep since transistor MX60 is turned off by the low voltage on its gate. The nodes Vg1, Vg2, Vg3 and Vg4 are outputs of a potential divider and are at successively reducing voltages between VextVpp and Vdd.

Assume that a high voltage source of 14V is connected to VextVpp and the control inputs are initially set such that hven and extVpp equal "0". Under such initial conditions extVpp_up equals "1", extVpp_en equals "0" and the output, Vswon, of the level shifter 500-1 is at Vss. Transistors MP5 and MP6 in FIG. 3 are turned on and a small current (say a few microamps) flows from VextVpp through the series p-channel devices to Vdd. The dimensions of transistors MP4, MP3, MP12, MP2, MP11, MP10, MP6 and MP5 are selected to produce a voltage division of approximately equal increments between VextVpp, Vg1, Vg2, Vg3 and Vg4. The wells of each p-channel transistor is connected to its source to allow VextVpp to be at a voltage as low as Vss without causing forward bias diode current from Vdd. Vg4 is at a voltage approximately equal to Vdd (this allows Vep to rise above the BVDSS of MX61 when Vep is driven by the charge pump 210). Since the gate of MX61 is at Vss there is no conduction path between VextVpp and Vep.

Assume, now, that both hven and extVpp change from logic "0" to logic "1". The resulting logic "1" on extVpp_en causes the level shifter 500-1 to change state and output a voltage equal to VextVpp on to the gates of MX60, MP6 and MP5. The current path from VextVpp to Vdd through MP6 and MP5 turns off and MX60 turns on. The nodes Vg1, Vg2, Vg3 and Vg4 now charge up towards VextVpp through the series p-channel devices connected to VextVpp. As a result, Vep also charges up towards VextVpp through the series-connected high voltage n-channel transistors MX63, MX62, MX0, MX60 and MX61. Due to the successively increasing gate voltages, the source/drain regions are also at successively increasing voltages and the large voltage difference that exists between VextVpp and Vep at the beginning of the charge up period is shared approximately equally across the series n-channel transistors. Thus the Vds across each transistor is less than Vds_sb and snapback does not occur, even though the amount of current flowing from VextVpp to Vep may be greater than Ids_sb. Vep continues to rise until Vg1, Vg2, Vg3 and Vg4 are fully charged to VextVpp, at which time the voltage on Vep would depend on the dimensions and characteristics of the series n-channel transistors and the current load on Vep. A ramp limit circuit 310 can optionally be connected to Vg4, as shown in FIG. 3. A ramp limit circuit 310 would consist of, for example, a capacitor or, in part, of a shunt transistor that would limit the rise time of Vg4 to a pre-defined ramp rate, as would be well known by a person of normal skill in the art. Due to the limited ramp rate of Vg4 the ramp rate of Vep would also be limited by a corresponding amount. The voltage division across the series p-channel transistors ensures that the voltage differences between Vg1, Vg2, Vg3 and Vg4 are always approximately equal, so the condition to avoid snapback (Vds less than Vds_sb) is always met.

A logic "0" on either hven or extVpp turns the voltage switch 300 off. The voltage on Vg4 returns to Vdd and the voltages on Vg1, Vg2 and Vg3 revert to the values determined by the potential divider outputs of the series p-channel devices. Vswon returns to Vss and the conduction path between VextVpp and Vep is turned off.

The successively lower voltages on the gates of the series high voltage transistors cause the source nodes of the transistors to be also at successively lower voltages. Thus, the voltage present on VextVpp may be higher than the BVDSS of the high voltage n-channel transistors, yet each transistor in the series path does not breakdown because the gate-to-drain voltage (Vgd) increases the breakdown voltage due to an effect commonly known as gate modulated breakdown (increased gated diode breakdown). Also when the series path is off, the gate of transistor MX61 is at Vdd, thus allowing Vep to rise to a voltage above BVDSS as may occur if the charge pump is enabled.

In addition to increased breakdown, the successively increasing voltages on the gates of the series transistors allow them to pass a current greater than Ids_sb without causing snapback. After Vswon switches to a high voltage to enable the series path, the voltage drop between VextVpp and Vep is shared across four transistors. The Vds across each of the transistors is therefore less than Vds_sb and the circuit avoids snapback.

While the voltage switch 300 can supply currents that are above Ids_sb from a high voltage supply, the series connection of four transistors would necessitate extremely wide transistors to satisfy the objective of several tens of milliamps.

Figure 4:
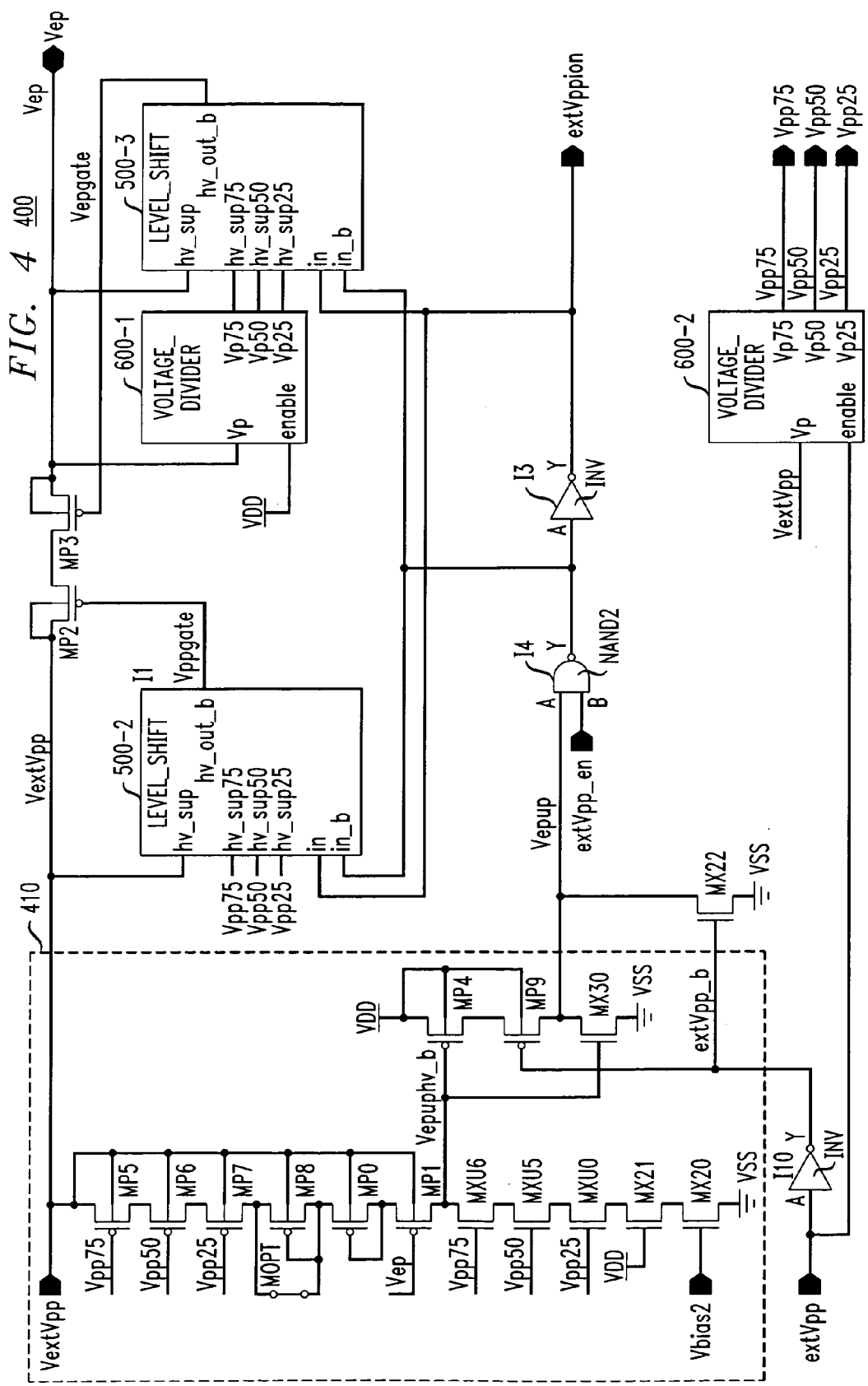
FIG. 4 is a schematic diagram of an exemplary current switch of FIG. 2.

FIG. 4 illustrates the current switch 400 of FIG. 2, in further detail. The current switch 400, shown in FIG. 4, operates in conjunction with the voltage switch 300 to provide a high current, low impedance path between VextVpp and Vep. While the voltage switch 300 can charge up Vep from a low voltage (Vdd) to a high voltage (VextVpp) without snapback, the current source capability of the switch is somewhat limited due to the connection of multiple transistors in series. A high current source capability would require extremely large transistors; a capability of several tens of milliamps with a low voltage drop (say 1V) would be impractical. Thus, the function of the current switch 400 is to provide the low impedance path, after the voltage switch 300 has increased Vep to a level within, say, 2V of VextVpp.

As discussed hereinafter, the current switch 400 consists of a voltage level detector 410 (MP0–1, MP4–9, MXU5, MXU6, MXU0, MX20–22 and MX 30), level shifter(s) 500-2, 500-3, discussed further below in conjunction with FIG. 5, and large current switch(es) (MP2–3). The voltage level detector 410 is similar to the voltage detect circuit 305 in the voltage switch 300, except that Vep is the voltage node which is being detected, as can be seen by the gate connection of transistor MP1. When Vep is low, MP1 conducts and the series p-channel transistors are able to pull node Vepuphv_b to a high voltage (note that the current sink capability of the n-channel side is limited by MX20 which has its gate connected to Vbias2, a current-defining bias voltage). As Vep rises (under the action of the voltage switch 300) MP1 switches off when Vep is greater than (VextVpp−2Vtp). Node Vepuphv_b discharges to Vss and, together with the logic "1" on extVpp, as provided by the voltage switch 300, the signal extVppion changes from logic "0" to logic "1". It should be noted that current flows through both the p-channel and the n-channel transistors until Vep is greater than (VextVpp−2Vtp). Thus, it is important to have voltage divider transistors on both the p-side (MP5–7) and the n-side (MXU0, MXU5–6) to avoid snapback.

While Vep is below the voltage detection level, extVppion is equal to "0" and high voltage levels are present at the outputs of the level shifters. Vppgate is at a voltage equal to VextVpp and Vepgate is at a voltage equal to Vep. MP2 and MP3 are both off and a conduction path does not exist between VextVpp and Vep. When Vep reaches the voltage detection level and extVppion changes to logic "1" the outputs of the level shifters change to Vss and MP2 and MP3 turn on. Vep now has a low impedance path to VextVpp and its voltage increases to a value approximately equal to VextVpp. At the time of switching, Vds across MP2 and MP3 is only about 2V so snapback does not occur. The logic "1" on signal extVppion indicates to external circuits that a high current load may now be applied to Vep. A high current load on Vep causes a slight voltage drop on Vep, by an amount that depends on the dimensions and characteristics of MP2–3 and the amount of current. The voltage drop should not be sufficient to cause the voltage level detector to change the state of the Vepup signal. Transistors MP0 and MP8 (connected with a metal option) are included in the voltage detector to reduce the voltage at which the level detector switches and avoid problems with application of very high current loads.

The two p-channel transistors MP2 and MP3 create a low impedance path between VextVpp and Vep. When Vep is within a voltage equal to two p-channel thresholds of VextVpp, the voltage on signal Vepup changes from Vss to Vdd. The signal extVppion changes from logic "0" to logic "1", causing the voltage on Vppgate to change from VextVpp to Vss and the voltage on Vepgate to change from Vep to Vss. The low voltage levels on the gates of MP2 and MP3 turn on the transistors such that a low impedance exists between VextVpp and Vep. It should be noted that during the time when a large potential difference exists between the source and drains of MP2 and MP3 (i.e., when Vep is rising under control of the voltage switch 300), there is essentially no current flow. The transistors MP2 and MP3 conduct current only when the voltage difference between drain and source has reached a low level, below Vds_sb. Thus, a high current switch action is performed without inducing snapback.

The level shifters 500-2 and 500-3, shown in FIG. 4 and discussed further below in conjunction with FIG. 5, create signals Vppgate and Vepgate and change their outputs while a high voltage exists on VextVpp and Vep. The prior art level shifters 1 and 2 depicted in FIG. 1, however, would enter snapback under such conditions. It is a further objective of this invention to perform such a level shift operation without inducing snapback.

As shown in FIG. 4, the current switch 400 includes two voltage dividers 600-1 and 600-2, discussed further below in conjunction with FIG. 6. A first voltage divider 600-1 creates a set of voltages that are divisions of Vep and are connected to the Level_Shift block 500-3 that creates Vepgate. A second voltage divider 600-2 creates a set of voltages labeled "Vpp25", "Vpp50" and "Vpp75" that supply the other Level_Shift block 500-2 (Vppgate) and are also connected to circuits in the voltage switch 300 of FIG. 3.

FIG. 5 shows a schematic diagram of a level shifter 500 incorporating features of the present invention. While the basic functionality of the level shifter 500 is similar to the level shifter of FIG. 1, there are four sets of transistors that act as voltage limiters on each of the current paths. Transistors MP2, MP3 and MP7 comprise a first voltage limiter 510; transistors MP1, MP0, and MP5 comprise a second voltage limiter 520; transistors MX22, MX21 and MX20 comprise a third voltage limiter 530; and finally transistors MX25, MX24 and MX23 comprise a fourth voltage limiter 540. The gates of each transistor in the set are connected to signals V25, V50 and V75 respectively.

The level shifter 500 of FIG. 5 also makes use of the outputs v25, v50, v75 of a voltage divider (which may be embodied, for example, as the voltage divider 600 shown in FIG. 6). Suppose that hv_sup is equal to 14V, V75 is equal to 10.5V, V50 is equal to 7V and V25 is equal to 3.5V. Consider the case where the input signal "in" changes from Vss to Vdd and the inverse signal "in_b" changes from Vdd to Vss. Initially, enhv_b is at 14V and enhv is at 0V; MP4 and MXU5 are on and MP6 and MXU14 are off. There is no current flow in any of the paths. As in changes from Vss to Vdd, MXU14 turns on and enhv_b is discharged from 14V to 0V. In a similar fashion to the voltage detector 305 of FIG. 3, the successively increasing gate voltages V25, V50 and V75 limit the maximum source voltages on MX22, MX21 and MX20 to 3.5V, 7V and 9.5V respectively. The instantaneous current can be quite large (several hundreds of microamps or more, depending on device dimensions and loading) yet Vds is always less than Vds_sb and snapback does not occur. The dimensions are similar for all transistors of the same type in a series path, thus the voltage drop across each transistor is approximately equal when the series path is turned on and remain approximately equal as enhv_b approaches Vss.

As enhv_b is discharged, MP6 turns on and current flows from hv_sup to charge node enhv. In a similar fashion to the n-channel transistors, the successively increasing gate voltages limit the minimum voltages on the drain/source nodes of the p-channel transistors. Under the same conditions as before, the minimum voltage on the drains of MP6, MP5, MP0 and MP1 at the beginning of the charge up period are approximately 11.5V, 8V, 4.5V and 0V respectively. As enhv charges up, the voltage difference between hv_sup and enhv is shared approximately equally across all transistors in the stack. Even though a large instantaneous current may flow, Vds is always less than Vds_sb and snapback does not occur.

FIG. 6 illustrates the voltage dividers 600 of FIG. 4 in further detail. As previously indicated, the voltage dividers 600 create voltages equal to approximately 25%, 50% and 75% of the level shifter supply input (hv_sup). Consequently, the drain/source voltages of transistors within each set are limited to approximately similar levels. Vds is below Vds_sb and both snapback and breakdown are avoided.

The voltage divider elements 610 can be constructed from a variety of possible components such as n-channel transistors, p-channel transistors or resistors. The exact construction is not important to the operation of the circuit provided that the components can perform the voltage division function over the voltage range. The four elements are of approximately equal impedance over the voltage range expected on the input pin Vp. Similarly, the details of the voltage-detect block 620 are not particularly important provided that a low level (say approximately equal to Vss) is output from the "out" terminal when Vp is greater than (Vdd+Vtp) and a high level (say approximately equal to Vdd) is output from the "out" terminal when Vp is equal to or less than Vdd+Vtp), where Vtp is a p-channel threshold voltage. There are many circuits which can satisfy the voltage-detect and the voltage divider functions of FIG. 6 that are well known to persons having normal skill in the art.

When Vp is less than (Vdd+Vtp) and a voltage approximately equal to Vdd exists on the gate of transistors MX24, MX27 and MX28, the current sourced by MP0–2 causes the three pairs of diode-connected transistors MX21/MX22, MX26/MX25 and MX28/MX210 to be forward biased and create voltages approximately equal to 2×Vtn, where Vtn equals an n-channel threshold. With a logic "1" level on the enable input, a voltage equal to 2×Vtn is present on all output pins Vp25, Vp50 and Vp75. Supposing that Vdd is equal to 2.5V and Vtn is equal to 0.6V, the output voltage is approximately 1.2V. As previously indicated, a voltage that is approximately midway between Vdd and Vss is required on Vp25, Vp50 and Vp75 so that series-connected transistors in the voltage protection circuits are always in a conductive state.

When Vp is greater than (Vdd+Vtp) and enable is equal to "1," the pairs of diode-connected devices are isolated and the voltages on nodes Vp25, Vp50 and Vp75 are determined mostly by the voltage division effects of the voltage divider elements. Note that transistors MX23, MX211 and MX20 turn off when Vp25, Vp50 and Vp75 are at a voltage above (Vdd−Vtn).

Conclusion

The voltage switch 300 charges Vep to a level approaching VextVpp and, when (VextVpp−Vep) is less than Vds_sb the current switch 400 is enabled and a low impedance path is connected between VextVpp and Vep. Thus high currents from a high voltage supply can be switched without inducing snapback or breakdown.

It is to be understood that the embodiments and variations shown and described herein are merely illustrative of the principles of this invention and that various modifications may be implemented by those skilled in the art without departing from the scope and spirit of the invention. In addition, the various assumptions made herein are for the purposes of simplicity and clarity of illustration, and should not be construed as requirements of the present invention.

I claim:

1. A high voltage, high current switching circuit comprising:
    a first set of transistors, wherein transistors of said first set of transistors are connected in series and include a plurality of transistors for switching a high voltage without inducing snapback or breakdown;
    a second set of transistors, said second set including one or more transistors for switching a high current and connected in parallel with said first set of transistors, and wherein said transistors within said second set of transistors are connected in series if said second set of transistors comprises two or more transistors;
    enabling means coupled to one or more gates of said second set of transistors, said enabling means causing conduction through said second set of transistors; and
    voltage detection means connected to a first output of said first and second sets of transistors, wherein an output of said voltage detection means is coupled to said enabling means.

2. The switching circuit of claim 1, wherein said first set of transistors is comprised of n-channel transistors.

3. The switching circuit of claim 1, wherein said second set of transistors is comprised of one or more p-channel transistors.

4. The switching circuit of claim 1, further comprising a charge pump connected to said first output of said first and second sets of transistors.

5. The switching circuit of claim 1, wherein an input of said first and second sets of transistors is a high voltage source that is external to a semiconductor circuit.

6. The switching circuit of claim 1, wherein gates of said transistors in said first set of transistors are biased to increasing voltages such that a voltage difference across said first set of transistors is shared across two or more of said transistors in said first set.

7. The switching circuit of claim 6, wherein said voltage difference across said first set of transistors is shared approximately equally across two or more of said transistors comprising said first set.

8. The switching circuit of claim 7, further comprising a ramp limit to limit a ramp rate of an output derived from said first output.

9. The switching circuit of claim 1, wherein an output derived from said first output is supplied to a non-volatile memory.

10. A high voltage switching circuit, comprising:
    an input and an output;
    said input connected to a plurality of series-connected transistors, each of said series-connected transistors having a gate biased to an increasing voltage such that a voltage difference across said plurality of series-connected transistors is shared across two or more of the series-connected transistors;
    a switching transistor connected in series with said plurality of series-connected transistors; and
    a protection transistor, said protection transistor connected in series between said switching transistor and said output, allowing a high voltage to be switched between said input and output without snapback while said switching transistor is conducting and allowing another high voltage to be applied to said output without breakdown while said switching transistor is not conducting.

11. The high voltage switching circuit of claim 10, wherein said voltage difference is shared approximately equally across two or more of said series-connected transistors.

12. A high voltage switching circuit, comprising:
    a plurality of cross-coupled high voltage inverters, wherein each of said cross-coupled high voltage inverters is comprised of a first plurality of n-channel series-connected transistors and a second plurality of p-channel series-connected transistors, each of said series-connected transistors having a gate biased to an increasing voltage such that a voltage difference across said first or second plurality of series-connected transistors is shared across two or more of the transistors comprising said plurality; and
    one or more switching transistors, each of said one or more switching transistors connected in series with any one of said plurality of series-connected transistors allowing a high voltage to be switched without snapback or breakdown.

13. The high voltage switching circuit of claim 12, wherein said voltage difference across said first or second plurality of series-connected transistors is shared approximately equally across two or more of said series-connected transistors contained in said first or second plurality of series-connected transistors.

14. A method for switching high voltages on a semiconductor circuit comprised of a first set of transistors, wherein transistors of said first set of transistors are connected in series and include a plurality of transistors for switching a high voltage without inducing snapback or breakdown, and a second set of transistors, said second set including one or more transistors for switching a high current and connected in parallel with said first set of series-connected transistors, and wherein said transistors within said second set of transistors are connected in series if said second set of transistors comprises two or more transistors, wherein said method comprises the steps of:
    charging a load from a high voltage source through said first set of transistors, whereby a total voltage difference across said first set of transistors is shared across two or more of the transistors comprising said first set; and
    enabling said second set of transistors when said total voltage difference is less than a predetermined value to form a high current path through said second set of transistors.

15. The method of claim 14, wherein said first set of transistors is comprised of n-channel transistors.

16. The method of claim 14, wherein said second set of transistors is comprised of one or more p-channel transistors.

17. The method of claim 14, wherein a charge pump is connected to an output of said first and second sets of transistors.

18. The method of claim 14, wherein said high voltage source is external to said semiconductor circuit.

19. The method of claim 14, wherein gates of said transistors in said first set of transistors are biased to increasing voltages such that a voltage difference across said first set of transistors is shared across two or more of the transistors comprising said first set.

20. The method of claim 19, wherein said voltage difference across said first set of transistors is shared approximately equally across two or more of the transistors comprising said first set.

21. The method of claim 20, further comprising limiting a ramp rate of said charging of said load.

22. The method of claim 14, further comprising supplying a voltage to a non-volatile memory, wherein said supplied voltage is derived from said switched high voltage.

23. The method of claim 14, wherein said predetermined value of said total voltage difference is approximately equal to a drain to source voltage required to induce snapback.

24. A method for avoiding snapback and for increasing the off-state breakdown voltage on a semiconductor circuit comprised of a plurality of series-connected first transistors, a series-connected switching transistor and a series-connected protection transistor, wherein said switching transistor is connected to said plurality of series-connected first transistors and said protection transistor is connected between said switching transistor and an output, said method comprising the step of:

biasing a gate of each of said series-connected first transistors with increasing voltages such that a voltage difference across said plurality of series-connected first transistors is shared across two or more of said series-connected first transistors; and biasing the gate of said protection transistor with a voltage to increase the breakdown of said protection transistor.

25. The method of claim 24, wherein said voltage difference across said series-connected first transistors is shared approximately equally across two or more of said series-connected first transistors.

* * * * *

UNITED STATES PATENT AND TRADEMARK OFFICE
CERTIFICATE OF CORRECTION

PATENT NO.        : 7,071,763 B2                                    Page 1 of 1
APPLICATION NO. : 10/378413
DATED             : July 4, 2006
INVENTOR(S)       : Blyth It is certified that error appears in the above-identified patent and that said Letters Patent is hereby corrected as shown below:

In the specification, column 3, line 61, after "circuit" and before "for" replace "1.00" with --100--.

Column 10, line 39, after "less than" and before "Vdd+Vtp)" insert --(--.

Signed and Sealed this

Fourteenth Day of October, 2008

JON W. DUDAS
*Director of the United States Patent and Trademark Office*